(12) United States Patent
Ba et al.

(10) Patent No.: US 9,582,775 B2
(45) Date of Patent: Feb. 28, 2017

(54) TECHNIQUES FOR ITERATIVE REDUCTION OF UNCERTAINTY IN WATER DISTRIBUTION NETWORKS

(71) Applicant: International Business Machines Corporation, Armonk, NY (US)

(72) Inventors: Amadou Ba, Dublin (IE); Francesco Fusco, Kilcock (IE); Olivier Verscheure, Dunboyne (IE)

(73) Assignee: International Business Machines Corporation, Armonk, NY (US)

( * ) Notice: Subject to any disclaimer, the term of this patent is extended or adjusted under 35 U.S.C. 154(b) by 1043 days.

(21) Appl. No.: 13/709,483

(22) Filed: Dec. 10, 2012

(65) Prior Publication Data

US 2014/0163916 A1     Jun. 12, 2014

(51) Int. Cl.
*G06Q 10/04*     (2012.01)
*G06F 17/50*     (2006.01)
(Continued)

(52) U.S. Cl.
CPC ....... *G06Q 10/043* (2013.01); *G06F 17/5009* (2013.01); *G06Q 10/04* (2013.01); *G06Q 10/06* (2013.01); *G06Q 50/06* (2013.01)

(58) Field of Classification Search
CPC ...................................................... G06F 15/00
(Continued)

(56) References Cited

U.S. PATENT DOCUMENTS

| | | |
|---|---|---|
| 7,457,735 B2 | 11/2008 | Wu et al. |
| 2002/0100584 A1* | 8/2002 | Couet .................... E21B 43/00 166/250.15 |

(Continued)

FOREIGN PATENT DOCUMENTS

| | | |
|---|---|---|
| CN | 201896332 U | 7/2011 |
| CN | 202153912 U | 3/2012 |

(Continued)

OTHER PUBLICATIONS

A. Bargiela, "An algorithm for observability determination in water-system state estimation," IEEE Proceedings, vol. 132, Pt. D, No. 6, Nov. 1985.*

(Continued)

*Primary Examiner* — Gregory J Toatley
*Assistant Examiner* — Michael Dalbo
(74) *Attorney, Agent, or Firm* — Kurt P. Goudy; Michael J. Chang, LLC (57) ABSTRACT

In one aspect, a method for reducing uncertainty in a hydraulic model of a water distribution network due to uncertain parameters and faults in the water distribution network is provided which includes the steps of: (i) calculating an optimized placement of sensors throughout a given uncertain section of the water distribution network; (ii) collecting data from the sensors; (iii) partitioning the given uncertain section of the water distribution network into observable and unobservable sub-sections based on the hydraulic model and a) a position, b) a number, and/or c) a type of the sensors that are available; (iv) correcting uncertain parameters and identifying faults for each of the observable sub-sections; (v) calculating a global uncertainty value for each of the unobservable sub-sections; and (vi) repeating the steps (i)-(vi) iteratively, at each iteration selecting an uncertain sub-section of the water distribution network, until no uncertain sub-sections of the water distribution network remain.

19 Claims, 2 Drawing Sheets

(51) Int. Cl.
G06Q 10/06 (2012.01)
G06Q 50/06 (2012.01)
(58) Field of Classification Search
USPC .............................................. 702/100; 703/9
See application file for complete search history.

(56) References Cited

U.S. PATENT DOCUMENTS

| | | | |
|---|---|---|---|
| 2002/0189362 | A1 | 12/2002 | Havlena |
| 2003/0015326 | A1 | 1/2003 | Haase, III |
| 2003/0093236 | A1* | 5/2003 | Wu ........................ G06N 3/126 702/85 |
| 2011/0191267 | A1 | 8/2011 | Savic et al. |
| 2011/0215945 | A1 | 9/2011 | Peleg et al. |
| 2012/0199208 | A1 | 8/2012 | Moreau et al. |
| 2012/0253673 | A1* | 10/2012 | Hamann ............ G01N 33/1886 702/2 |
| 2014/0052421 | A1* | 2/2014 | Allen .................... G05B 17/02 703/2 |

FOREIGN PATENT DOCUMENTS

| | | |
|---|---|---|
| FR | 002932684 A1 | 12/2009 |
| KR | 20100078091 A | 7/2010 |
| KR | 100993798 B1 | 11/2010 |
| WO | WO2012036633 A1 | 3/2012 |

OTHER PUBLICATIONS

Preis, "Efficient Hydraulic State Estimation Technique Using Reduced Models of Urban Water Networks" Journal of Water Resources Planning and Management © ASCE / Jul./Aug. 2011.*
Krause, "Efficient Sensor Placement Optimization for Securing Large Water Distribution Networks", Journal of Water Resources Planning and Management © ASCE / Nov./Dec. 2008.*
Kapelan, Z., D.A. Savić and Walters, G.A. (2007), Calibration of WDS Hydraulic Models using the Bayesian Recursive Procedure, ASCE Journal of Hydraulic Engineering, vol. 133, No. 8.*
English Machine Translation of KR100993798B1 (Dec. 2012).
M. Cisty et al., "Automated Calibration of Irrigation Projects Simulation Model by Harmony Search Optimization," International Symposium on Water Management and Hydraulic Engineering, Ohrid/Macedonia, Sep. 1-5, 2009.
S. Shu et al., "Modified Methods on Testing Roughness Coefficient of Water Pipes in Urban Water Distribution Network," ICPTT 2009: Advances and Experiences with Pipelines and Trenchless Technology for Water, Sewer, Gas, and Oil Applications, Shanghai, China (Oct. 18-21, 2009).
F.B. Prinz et al. "Automatic Monitoring of Valve Status," Report to the U.S. Department of Energy Deputy Assistant Secretary for Breeder Reactor Programs Washington, D.C. 20545 (Jan. 1988).
A. Preis et al., "Multi-objective Sensor Network Placement Model for Integrated Monitoring of Hydraulic and Water Quality Parameters," World City Water Forum (WCWF 2009), Incheon, Korea (Aug. 2009).
M. Luong et al., "Observability, Redundancy, Reliability and Integrated Design of Measurement Systems," Proc of the 2nd IFAC Symposium on Intelligent Components and Instruments for Control Applications, SICICA'94 (Jun. 8-10, 1994).
J. Gertler et al., "Leak Detection and Isolation in Water Distribution Networks using Principal Component Analysis and Structured Residuals," 2010 Conference on Control and Fault-Tolerant (SysTol), pp. 191-196 (Oct. 6-8, 2010).
R. Perez et al., "Leakage Isolation using Pressure Sensitivity Analysis in Water Distribution Networks: Application to the Barcelona case study," Proceedings of the 12th IFAC Symposium on Large Scale Systems: Theory and Applications (2010), France, vol. 9, Part 1.
Tolson, Bryan A et al; "Genetic Algorithms for Reliability-Based Optimization of Water Distribution Systems"; Journal of water resources planning and management ; ASCE ; Jan./Feb. 2004.
K. Duzinkiewicz, "Set Membership Estimation of Parameters and Variables in Dynamic Networks by Recursive Algorithms with a Moving Measurement Window," Int. J. Appl. Math. Comput. Sci., 2006, vol. 16, No. 2, 209-217.
B.M. Sanandaji et al., "Exact Topology Identification of Large-Scale Interconnected Dynamical Systems from Compressive Observations," 2011 American Control Conference, Jun. 29-Jul. 1, 2011.
J.P. Modisette, "Automatic Tuning of Pipeline Models," PSIG Annual Meeting, Palm Springs, CA, Oct. 20-22, 2004.
J. Rougier, "Probabilistic Leak Detection in Pipelines Using the Mass Imbalance Approach," Journal of Hydraulic Research, vol. 43, No. 5 (2005), pp. 556-566.
O. Begovich et al., "Application of a Leak Detection Algorithm in a Water Pipeline Prototype: Difficulties and Solutions," 2008 5th International Conference on Electrical Engineering, Computing Science and Automatic Control (CCE 2008).
V. Isler et al., "Sampling Based Sensor-Network Deployment," Proceedings on the 2004 IEEE/RSJ International Conference on Intelligent Robots and Systems, 2004 (IROS 2004).

* cited by examiner

TECHNIQUES FOR ITERATIVE REDUCTION OF UNCERTAINTY IN WATER DISTRIBUTION NETWORKS

FIELD OF THE INVENTION

The present invention relates to analysis of water distribution networks (WDNs) and more particularly, to techniques for iteratively reducing uncertainty in WDN models.

BACKGROUND OF THE INVENTION

Simulation models of water distribution networks (WDNs) are fundamental for management, operational and monitoring purposes. Typical usage of the models range from pumps scheduling, management of the pressures at the nodes of the network, identification of faults (e.g., leaks), monitoring of water quality, etc.

WDN models available to utility companies, however, are often inaccurate due to the imperfect representation of the complete physical process and the incomplete knowledge of all of the required parameters. The uncertainty in the models is typically reduced with the calibration, where the parameters are adjusted such that pressures and flows predicted by the model match a set of actual observed field data to some desirable or acceptable level. Many methods have been proposed for the solution of the calibration problem. Methods for the optimal placement of sensors around the network have also been studied, in order to maximize the sensitivity of certain desired parameters to the collected data and therefore improve the quality of the estimation.

A major issue with the reduction of uncertainty in WDN models is the scarcity of measurement points around the network, with the number of parameters to be adjusted usually being much larger than the available measurements. Calibration can therefore only be successful on a selected subset of parameters of the model, which usually leaves significant uncertainty in major areas of the WDN model. Another issue, also related to the poor availability of measurement points, is the exact localization of the source of uncertainty. In some situations, in fact, an inconsistency between model predictions and field measurements could ambiguously be related to a number of different parameters or to a fault (e.g., leaks) in the network, the problem of exactly inferring the source of uncertainty could be undetermined with the available measurements.

Therefore, improved techniques for reducing uncertainty in WDN models that solves the problem of having scarce measurement points around the network would be desirable.

SUMMARY OF THE INVENTION

The present invention provides techniques for analysis of water distribution networks (WDNs). In one aspect of the invention, a method for reducing uncertainty in a hydraulic model of a water distribution network due to uncertain parameters and faults in the water distribution network is provided. The method includes the steps of: (i) calculating an optimized placement of sensors throughout a given uncertain section of the water distribution network; (ii) collecting data from the sensors; (iii) partitioning the given uncertain section of the water distribution network into observable and unobservable sub-sections based on the hydraulic model and one or more of a) a position, b) a number, and c) a type of the sensors that are available; (iv) correcting uncertain parameters and identifying faults for each of the observable sub-sections; (v) calculating a global uncertainty value for each of the unobservable sub-sections; and (vi) repeating the steps (i)-(vi) iteratively, at each iteration selecting an uncertain sub-section of the water distribution network, until no uncertain sub-sections of the water distribution network remain.

In another aspect of the invention, a system for reducing uncertainty in a hydraulic model of a water distribution network due to uncertain parameters and faults in the water distribution network is provided. The system includes a sensor placement module configured to calculate an optimized placement of sensors throughout a given uncertain section of the water distribution network; a diagnosis and calibration module configured to (a) partition the given uncertain section of the water distribution network into observable and unobservable sub-sections based on the hydraulic model and one or more of a position, a number, and a type of the sensors that are available, (b) correct uncertain parameters and identify faults for each of the observable sub-sections, and (c) calculate a global uncertainty value for each of the unobservable sub-sections.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for the iterative reduction of uncertainty in water distribution networks, which are able to overcome the practical difficulty of poor availability of field measurement points and faults (e.g., leaks, malfunctioning valves or pumps) across the network. As will be described in detail below, at each iteration, focus is put on uncertain sub-sections of the network, where the present method calculates the optimal measurement points and conditions given the number of available sensors. The present method then automatically partitions the network into observable and unobservable sub-sections. For each observable sub-section the uncertain parameters/faults (i.e., parameter errors and network faults) are identified (localized) and the parameter errors are corrected, while a coarse uncertainty estimation for the unobservable sub-sections is produced—which indicates that further exploration is required. At the next iteration, focus is moved to one of the uncertain sub-sections.

With regard to the distinction between parameter errors and network faults, the idea is that the uncertainty that we try to localize may come from two main sources: model uncertainties (e.g., wrong or incorrect parameters of the hydraulic model, like pipe roughness) or real process faults (e.g., the presence of a leak, a valve or a pump not functioning properly). The present techniques can ultimately identify both sources of uncertainty. However, calibration (see below) can only correct the model with respect to the former (modeler parametric uncertainties), while the latter can only be corrected by physical intervention on the field.

An uncertain sub-section is a collection of network nodes (a part/section of the network) and connecting pipes where a mismatch is experienced between sensor measurements and model predictions. At the first iteration of the process (initialization) the uncertain sub-section is the whole network. At each subsequent iteration, the system then separates the part of the network being analyzed into sub-sections for which a global uncertainty measure is calculated. At the next iteration the user chooses to focus the analysis on one of these sub-sections.

Specifically, each iteration of the method consists of an analysis of one "section" of the network and produces an output consisting of "sub-sections" of the network. Each of the output "sub-sections" can become the "section" analyzed in the following iteration(s), which could iteratively separate it further into smaller "sub-sections." The idea is that when an iteration is being described, the section is the part of the network under analysis and the sub-sections are the output of the iteration.

With regard to uncertain/observable/non-observable sub-sections, each iteration of the method, by analyzing a section of the network, partitions the section into sub-sections. Some of the sub-sections are observable and a full diagnosis/localization is provided, so these sub-sections are not uncertain anymore (all anomalies, if present, have been identified). Some of the sub-sections are non-observable and only a measure of the level of uncertainty in those sub-sections is presented.

Based on this, the "uncertain sub-sections" are non-observable sections, for which the iteration produced a global measure of the uncertainty (how much these sub-sections seem to contain some source of anomaly). So, based on the above, these are candidate sub-sections to be explored and analyzed at the next iteration.

The "uncertain sub-section" (i.e., one of the candidate sub-sections) selected for the next iteration, is one of the "non-observable sub-sections" for which a global measure of uncertainty has been produced. In fact, although the user knows now that these sections are "uncertain" and by how much, he/she knows that there is something wrong there, but the user does not know what, and needs to further explore that area of the network.

The user of the system, at each iteration, can choose a part of the network (section) to analyze. Usually, unless the user already knows about a specific part of the network containing uncertainties or anomalies (based on some external source of information), he/she will choose the whole network at a first iteration, but not necessarily. Then, as a result of the iteration, the method would produce sub-parts (sub-sections) of the section under analysis (this could be the whole network at the first iteration). Based on this output and the global measure of uncertainty assigned by the method to each sub-section of the network the user selects which of these sub-sections the method should analyze in the next iteration.

Observable sub-sections indicate a part (group of nodes/pipes) of the network where enough sensor data are available such that it is possible to clearly identify the source of uncertainty (parameters or faults). The uncertainty identification can be done using classical residual analysis (difference between measurements and model predictions). Once identified, the uncertain parameters can be corrected with known model identification or calibration techniques. By way of example only, see M. Cisty et al., "Automated Calibration of Irrigation Projects Simulation Model by Harmony Search Optimization," International Symposium on Water Management and Hydraulic Engineering, Ohrid/Macedonia, 1-5 Sep. 2009, the contents of which are incorporated by reference herein. The uncertain faults are not corrected (they are physical problems, which are identified and the user is simply acknowledged about them—see above).

In the case where the number of available sensors is too small to have any meaningful diagnosis, an automatic method is provided herein for sensor placement where multiple sets of measurements are collected at different points of the network and at different times within one iteration of the method described above. The different sets of measurements are then properly integrated in the diagnosis/correction step of the method above.

By "meaningful diagnosis" it is meant that in some particular cases the number of available sensors and their position in the network is not good enough to successfully separate the network into sub-sections and produce a measure of the uncertainty for each one of them. In these cases multiple measurement collection iterations (where the few available sensors are moved at different points at each iteration) are required before a single diagnosis step is performed.

While conventional methods for the calibration of water distribution networks only allow for the calibration/estimation of a selected and non-complete sub-set of the uncertain parameters, the present method allows for the correct localization and correction of the uncertainty over a water distribution network, without the need for limiting the diagnosis to a number of parameters. The present method itself guides the user through the iterations for the exploration of the network model, progressively indicating where the uncertainty is and producing less uncertain estimates.

Figure 1:
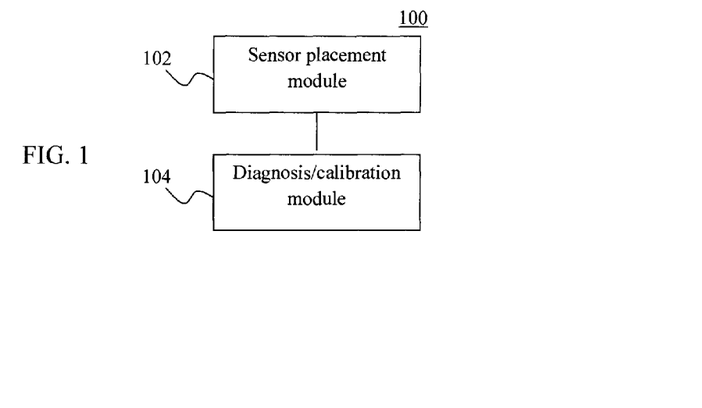
FIG. 1 is a schematic diagram illustrating an exemplary system for performing the present iterative process for reducing uncertainty in a water distribution network (WDN) model according to an embodiment of the present invention.

The details of the present techniques will now be described by way of reference to the following non-limiting embodiments. FIG. 1 is a schematic diagram illustrating an exemplary system 100 for performing the present iterative process for reducing uncertainty in a water distribution network (WDN) model. System 100 may be embodied in an apparatus, such as apparatus 300 shown in FIG. 3, described below.

According to an exemplary embodiment, system 100 is a software program that includes two main components. As shown in FIG. 1, these components include (but are not limited to) i) a sensor placement module 102, and ii) a diagnosis/calibration module 104. The interaction of the components with each other and (optionally) with a user (via a user interface—not shown) provides a solution to the reduction of uncertainty in the model of a water distribution network (WDN). See below. A hydraulic model consisting of the connectivity and the parameters of nodes and pipes is need for the process. This model is utilized both by the sensor placement module and by the diagnosis/calibration module. The hydraulic model is an input provided to the user at the start of the method (initialization). This is typically available from network operators in the form of set of nodes/links, their parameters and their connectivity graph, usually in electronic format (text or binary file).

Figure 2:
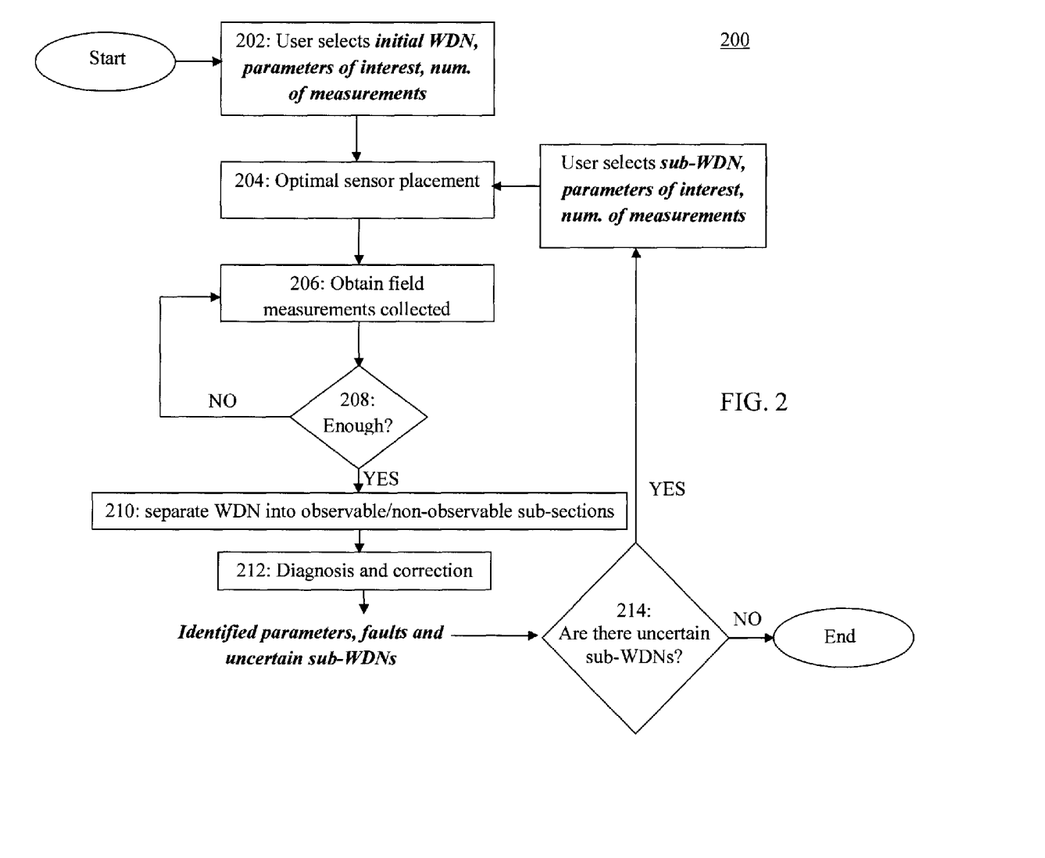
FIG. 2 is a diagram illustrating exemplary methodology for iteratively reducing uncertainty in a WDN model according to an embodiment of the present invention.

FIG. 2 is a diagram illustrating exemplary methodology 200 for iteratively reducing uncertainty in a WDN model according to the present techniques. In step 202, a user initializes the process with a desired network (or section of the network). As provided above, in a first iteration (an initialization) the whole network may constitute the "uncertain sub-section" chosen. In step 202 the user can (optionally) also set some prior knowledge about the uncertainty of parameters, if this information is available to the user. This information can include, but is not limited to, certainty/uncertainty information about pipe parameters (roughness, diameter), nodes demand, valve operational status, etc. The uncertainty can be expressed as a typical value interval (e.g., the pipe diameter belongs to the interval 9-12 inches) or as mean and standard deviation (e.g., the pipe diameter is 9±2 inches). By way of example only, the pipe roughness may be calculated according to the techniques presented in S. Shu et al., "Modified Methods on Testing Roughness Coefficient of Water Pipes In Urban Water Distribution Network," ICPTT 2009: Advances and Experiences with Pipelines and Trenchless Technology for Water, Sewer, Gas, and Oil Applications, Shanghai, China (Oct. 18-21, 2009) (hereinafter "Shu"), the contents of which are incorporated by reference herein. While in practice the value of all parameters is available and can be provided, Shu makes the point that some of them (roughness in this case) are not known exactly and an uncertainty around them may be calculated. Valve operational status may be evaluated by the techniques described in F. B. Prinz et al. "Automatic Monitoring of Valve Status," Report to the U.S. Department of Energy Deputy Assistant Secretary for Breeder Reactor Programs Washington, D.C. 20545 (January, 1988), the contents of which are incorporated by reference herein. The user then inputs the position of fixed measurement points in the network and the number (and type) of available sensors that can be freely placed throughout the network. The fixed measurement points are the available sensors whose position in the network is fixed and cannot be changed, at least not without big effort/cost. The user knows their position from design information of the water network. The present method provides optimal positioning for the sensors that the user is willing to move (not fixed), that is why such information is required as input. The term "user" here refers generically to one or more human users of the present system. Thus "user" as provided herein may refer to more than one person.

The first iteration of methodology 100 is then started in step 204 by automatically calculating the optimal placement of the (both number of sensors and types of sensors) sensors throughout the network, such that the diagnosis/calibration that follows (see below) can be most effective. By way of reference to system 100 of FIG. 1 described above, this step of calculating the optimal placement of the sensors may be performed by the sensor placement module. The required position of the sensors, as well as an indication of a minimum time-window for the observations (also calculated, for example, by the sensor placement module), is output to the user and field data are collected accordingly via the sensors. The optimal time window is as long as possible and hence why a minimal time-window is specified. The optimal time window could be calculated based on the required statistical significance of the diagnosis/correction method (e.g., accurate with 95% probability) and it is related to the number of measurement points, to the number of uncertain parameters and to the statistical assumptions of the uncertainty. In the case that the available number of sensors specified by the user is not enough to produce a meaningful diagnosis (see steps 210-212), this step also provides an optimal positioning for an additional minimum number of sensors that would be required. In the latter case, the measurements collection steps described in the following (steps 206-208) would require multiple iterations before the diagnosis.

By way of example only, the sensors that might be employed in a WDN include, but are not limited to, hydraulic sensors such as water pressure sensors, water flow sensors. Other types of sensors that might be employed include, but are not limited to, water temperature sensors, water quality sensors, etc. Each of these types of sensors is commercially available. These sensors are however expensive and thus each type of sensor cannot be implemented at every conceivable position of interest in the WDN. Thus, the present placement optimization is needed. As highlighted above, it is assumed herein that some sensors available can be freely placed throughout the WDN (i.e., it is possible that some of the sensors are fixed and cannot be moved—for these fixed sensors the present process does not provide optimal placement).

Optimization of the placement of the available sensors may be carried out using any suitable optimization process. Sensor placement optimization is described in detail below.

In step 206, the field measurements collected (via the sensors—i.e., sensor data) are obtained. Although the optimal-placement (for obvious reasons) does not provide positioning for fixed sensors, data from the fixed sensors (as well as data from the optimally placed sensors) are still considered by the present method, because it is valuable information. Measurement collection, therefore is from "all" available sensors, fixed and movable, where the latter have been moved to the location indicated by the sensor-placement module.

According to an exemplary embodiment, the sensor data is obtained from the user who enters the field observed data. Alternatively, the sensors employed can be configured to (e.g., either through a wired connection or wirelessly) automatically transmit the data collected to an apparatus (such as apparatus 300 of FIG. 3) that is performing methodology 200. The field data collected may include, for example, hydraulic data such as pressures and flows at one or more nodes of the network. A node in a WDN is simply the end of a pipe in the network.

Along with the data, the user may also enter information for the hydraulic model including, but not limited to, the demand conditions (e.g., relating to the time of day when data was collected from a given node, and the typical demand profiles at the different nodes of the network) and the operating conditions of the active components of the network, such as storage tank levels, pressure control valve settings and pump operation speeds. If the sensor data is automatically obtained as provided above (instead of requiring the user to enter sensor data) then a user interface may still be provided for the user to enter this supporting data.

In step 208 a determination is made as to whether enough field measurements have been made. This is in the case that the optimal sensor placement in step 204 produced the optimal position of more sensors than are available, because otherwise the following diagnosis step would not be able to separate the network into sub-sections. In this situation the user would have to use some of the sensors to collect measurements at more than one point of the network over different time windows. If enough data has been collected (i.e., in order to perform the diagnosis and calibration steps described below), then the process continues at step 210. However, if it is determined in step 208 that more data is needed, then step 206 is repeated to obtain more field measurements (e.g., after one or more of the sensors have been moved) and an evaluation is again made to as to whether the data is sufficient. By way of example only, as provided above, the field data may include hydraulic data such as pressures and flows at one or more nodes of the network collected at a certain time-window. To obtain more data, the user can move one or more of the (non-fixed) sensors to another point and collect data (although it will be over a different time window).

In step 210, based on the hydraulic model of the network and on the available measurements (obtained in step 206), the section of the network currently under study is separated into observable and non-observable sub-sections. According to an exemplary embodiment, step 210 is performed based on a network observability analysis. See, for example, A. Bargiela, "An algorithm for observability determination in water-system state estimation," IEE Proceedings, Vol. 132, Pt. D, No. 6, November, 1985 (hereinafter "Bargiela"), the contents of which are incorporated by reference herein. For example, in Bargiela, the section in g of the network is partitioned into observable and non-observable sections based simply on the model and position of the available sensors. Specifically, the method in Bargiela is based on graph theory, where the connectivity graph of the hydraulic model is partitioned iteratively based on whether or not each node has a sensor and of what type. That, or any other suitable partitioning method may be used in accordance with the present techniques.

In step 212, based on the field data collected, the method then automatically runs a diagnosis/calibration module (see system 100 of FIG. 1, described above). By diagnosis it is meant herein that an uncertainty in the model is estimated, and through calibration the uncertainty is reduced. As will be described in detail below, the "diagnosis" involves calculating uncertainty for both observable and non-observable sub-sections of the network. For sources of uncertainty in the observable sub-sections, the uncertainty is localized, which means the source and position of the uncertainty is identified. In the case where the uncertainty lies in the hydraulic model (for example wrong pipe roughness), the calibration module corrects it, otherwise if the uncertainty is due to a process anomaly (e.g., a leak, valve malfunctioning, etc.) the system simply flags it to the user. Namely, as described above, the uncertainty reduction through calibration is only done when it is due to a wrong model parameter, while the source of the uncertainty is simply flagged when it is due to a process fault, where correction can only be done with physical intervention on the system. Calibration of water distribution model is described generally in M. Cisty et al., "Automated Calibration of Irrigation Projects Simulation Model by Harmony Search Optimization," International Symposium on Water Management and Hydraulic Engineering, Ohrid/Macedonia, 1-5 Sep. 2009 (hereinafter "Cisty"), the contents of which are incorporated by reference herein. In Cisty, the calibration of a water distribution model is described as the process of comparing pressures and flows predicted with observed pressures and flows for known operating conditions, such as pump operation, tank level, pressure-reducing valve settings, and adjusting the input model for the data to improve the agreement between the observed and predicted values.

At this stage, the method returns results to the user, where the results are identified parameters and faults for observable sections, and uncertainty value for non-observable sections. See FIG. 2. As highlighted above, for each non-observable sub-section, a global uncertainty value is calculated and provided to the user, which indicates how uncertain that region is, but that further exploration (e.g., with more sensors) is required in order to locate and estimate the source of uncertainty. One way to estimate the level of uncertainty in a non-observable part of the network is by calculating the difference between sensor measurements in the network section and predictions from the hydraulic model. Statistical testing can be applied to this difference value in order to improve its significance by assigning a confidence value as well (e.g., the uncertainty value with a confidence of 95%).

Step 212 is also referred to herein as a diagnosis step of the methodology. Specifically, step 212 carries out the diagnosis of each sub-section produced by step 210 (observable and non-observable).

For each observable sub-section, the source of uncertainty, where present, is localized and corrected. More specifically, the method automatically estimates updated values for the parameters of the network (e.g., pipe roughness, diameter, nodes demand, valves operational status) or indicates the presence of a fault (e.g., leak). See below.

In step 214, based on the above described diagnosis/calibration process, a determination is made as to whether there are uncertain sub-sections of the network remaining and whether focus should be shifted to those uncertain regions. By way of example only, this decision may be made by the user based on the information obtained from the previous diagnosis/calibration process. As shown in FIG. 2, if and when there are no further uncertain sub-sections of the network remaining then the process is ended.

However, when uncertain sub-sections of the network remain, the previous steps, from the calculation of the optimal sensors placement to the calibration and uncertainty estimation, are then repeated in an iterative fashion—beginning with the user selecting one or more sub-sections of the network. As described above, at this step the user can also set some prior knowledge about the uncertainty of parameters (e.g., certainty/uncertainty information about pipe parameters (roughness, diameter), nodes demand, valve operational status, etc.) if this information is available to the user. The process is then repeated in an iterative fashion until there are no uncertain sub-sections of the network remaining.

The aspects of the above-provided method are now described in further detail. The components of the present system can be implemented as follows.

Sensors Placement—

Based on the number of available sensors and the model of the network (or the sub-section of the network) on which the current iteration of the method is focused, an optimization process provides the optimal placement of the sensors. As provided above, optimization of the placement of the available sensors may be carried out using any suitable optimization process. For illustrative purposes only, by way of example, one suitable process for optimizing placement of the sensors according to the present techniques is described in A. Preis et al., "Multi-objective Sensor Network Placement Model for Integrated Monitoring of Hydraulic and Water Quality Parameters," World City Water Forum (WCWF 2009), Incheon, Korea (August, 2009) (hereinafter "Preis"), the contents of which are incorporated by reference herein. In Preis, a method for sensor placement is provided for drinking water utilities that maximizes both contaminant event sensor detection likelihood as well as sensor hydraulic sensitivity to variations in nodal demand.

Preferably, the optimization problem maximizes the sensitivity function of the measured variables to the parameters of interest in the network. See for example Preis where the sensor sensitivity to variations in nodal demand are maximized. The optimization can be solved by using any existing process for non-linear problems, such as genetic algorithms or mixed integer programming, the application of which to the sensor optimization problem, given the instant teachings, would be apparent to one of skill in the art.

Diagnosis/Calibration—

Based on the hydraulic model of the water network, a measurement model that relates the available measurements to the network states is built, where the states of interest are the uncertain parameters of the network, specifically the pipes resistance (which summarizes all of the physical parameters of the pipes, including diameter, roughness, presence of leak, etc. . . . ). The model is linearized around the operating point, given by the field measurements collected by the user (the sensor readings) and by the operating conditions provided by the user—see above. One example of operating conditions provided by the user are the nodal demands. Known observability processes are run and the network is separated in observable and non-observable sections. By way of example only, a suitable observability process for use herein is described in M. Luong et al., "Observability, Redundancy, Reliability and Integrated Design of Measurement Systems," Proc of the $2^{nd}$ IFAC Symposium on Intelligent Components and Instruments for Control Applications, SICICA '94 (Jun. 8-10, 1994) (hereinafter "Luong"), the contents of which are incorporated by reference herein. Luong addresses the issue of sensor placement and provides an observability algorithm that takes into account measured and unmeasured variables.

Next, for each observable and non-observable section, the model is used for elaborating a fault diagnosis strategy which operates through the detection, the localization and the severity estimation of the uncertainty. The detection of the uncertainty might be based on residuals calculation. The residual is an uncertainty indicator and is computed through the difference between the actual field measurements (i.e., data from the sensors) and the values predicted by the model. In the absence of uncertainties, the residual should be equal to zero and becomes different from zero in the opposite case. For a discussion of the use of residuals in fault diagnosis in water distribution systems see, for example, J. Gertler et al., "Leak Detection and Isolation in Water Distribution Networks using Principal Component Analysis and Structured Residuals," 2010 Conference on Control and Fault-Tolerant (SysTol), pgs. 191-196 (Oct. 6-8, 2010), the contents of which are incorporated by reference herein.

The hydraulic model, by allowing one to determine the residuals, is a mathematical expression linking the pressure drop between the extremities of a given pipe and the associated flow rate. Specifically, the hydraulic model can be regarded as a characterization of the physical parameters of the pipe and this methodology is sufficiently reliable for building model-based uncertainty estimation. In order to improve the reliability on the decision to be made with respect to the uncertainty status of the section of the network, the computed residuals can be associated with statistical hypothesis testing. In this context, the main characteristics of the tests will be established from the mean and the variance of residuals. Hypothesis testing is commonly used in residual analysis for anomaly detection. It consists of making an assumption about the probability distribution of the residuals in normal conditions. Then, when the residuals are calculated, they are tested against this assumption. The output of the test is whether the value of the residuals indicates normal condition (everything is okay) or abnormal behavior (something is wrong), in a statistical sense (that is with a certain probability). In the case of abnormal behavior the magnitude of the residual also indicates the severity of the anomaly (how far from normal conditions we are).

For the non-observable sections, the outcome of the statistical test is presented to the user, indicating whether the section contains uncertainty/faults or not. For the observable sections, the measurements are sufficient to operate a localization of the uncertainty.

This localization is based on an analysis of the features of the residuals, both in the time and in the frequency domain. Different features can be mapped to different sources of uncertainty, which can be a fault (e.g., a leak) or an incorrect parameter (i.e., parametric uncertainties). An incorrect parameter is a parameter of the hydraulic model that the diagnosis indicates to be incorrect. For example the roughness of the pipes is typically not known with accuracy. The localization step in the diagnosis may indicate that one roughness coefficient is not what was specified in the model. The calibration step would then correct it.

It is notable that localization here means identification of the source and position of the uncertainty/anomaly. That is what caused uncertainty/anomaly (roughness parameter, pipe diameter parameter, presence of a leak, . . . ) and where it is in the network.

According to the available sensors, the residuals calculated in the diagnosis step are available at different points in space and time across the network. One way of performing localization is to identify how different sources of uncertainty produce different patterns in the spatio-temporal collection of residuals. For example, based on the model sensitivity analysis, one could build a classification model that, given the pattern in the residual, outputs what is the most probable cause that produced it. Such a classifier can be built using the hydraulic model and simulating the different types of uncertainties/faults that can appear in the network. See, for example, R. Perez et al., "Leakage Isolation using Pressure Sensitivity Analysis in Water Distribution Networks: Application to the Barcelona case study," Proceedings of the 12th IFAC Symposium on Large Scale Systems: Theory and Applications (2010), France, Volume 9, Part 1, the contents of which are incorporated by reference herein.

After localization, parametric uncertainties are corrected by updating the model such that the residual is zero. This can be done with non-linear optimization methods, where the residual is minimized such as for example a Gauss-Newton method that minimizes a weighted sum of the squared residuals. If the uncertainty is due to the presence of a leak, the position of the leak is estimated from analysis of the residuals and knowledge of the hydraulic model.

Figure 3:
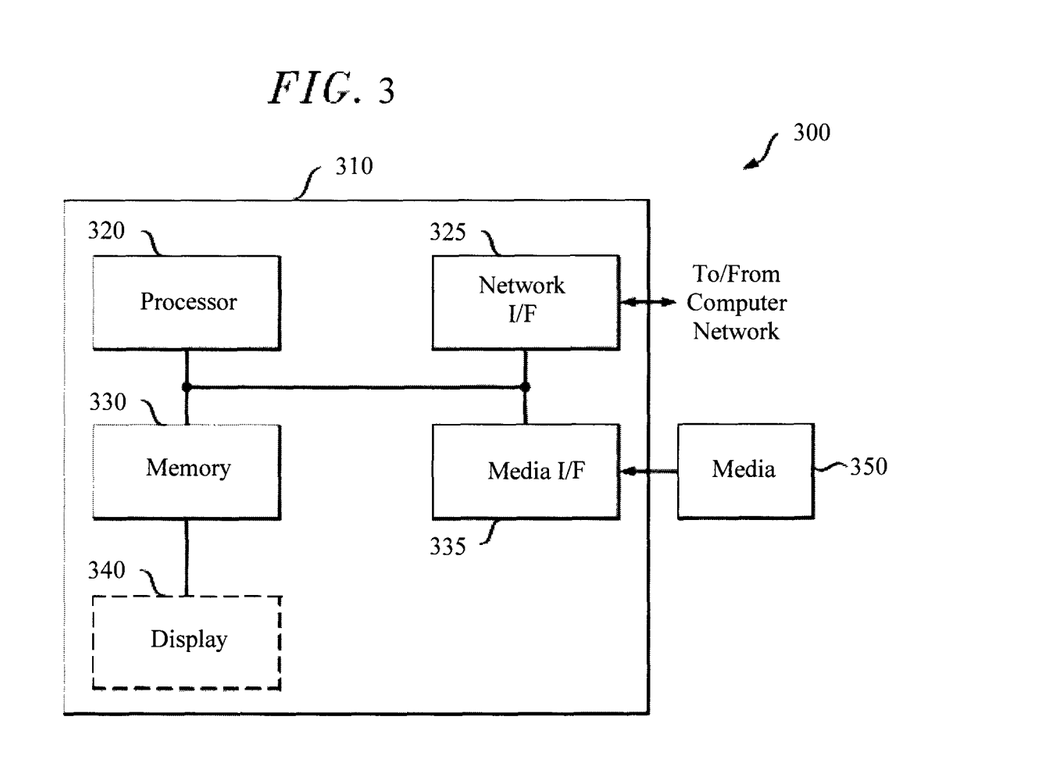
FIG. 3 is a diagram illustrating an exemplary apparatus for performing one or more of the methodologies presented herein according to an embodiment of the present invention.

Turning now to FIG. 3, a block diagram is shown of an apparatus 300 for implementing one or more of the methodologies presented herein. By way of example only, apparatus 300 can be configured to implement one or more of the steps of methodology 200 of FIG. 2 for reducing uncertainty in a hydraulic model of a water distribution network due to uncertain parameters and faults in the water distribution network.

Apparatus 300 includes a computer system 310 and removable media 350. Computer system 310 includes a processor device 320, a network interface 325, a memory 330, a media interface 335 and an optional display 340. Network interface 325 allows computer system 310 to connect to a network, while media interface 335 allows computer system 310 to interact with media, such as a hard drive or removable media 350.

As is known in the art, the methods and apparatus discussed herein may be distributed as an article of manufacture that itself comprises a machine-readable medium containing one or more programs which when executed implement embodiments of the present invention. For instance, when apparatus 300 is configured to implement one or more of the steps of methodology 200 the machine-readable medium may contain a program configured to (i) calculate an optimized placement of sensors throughout a given uncertain section of the water distribution network; (ii) collect data from the sensors; (iii) partition the given uncertain section of the water distribution network into observable and unobservable sub-sections based on the hydraulic model and one or more of a) a position, b) a number, and c) a type of the sensors that are available; (iv) correct uncertain parameters and identify faults for each of the observable sub-sections; (v) calculate a global uncertainty value for each of the unobservable sub-sections; and (vi) repeat the steps (i)-(vi) iteratively, at each iteration selecting an uncertain sub-section of the water distribution network, until no uncertain sub-sections of the water distribution network remain.

The machine-readable medium may be a recordable medium (e.g., floppy disks, hard drive, optical disks such as removable media 350, or memory cards) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used.

Processor device 320 can be configured to implement the methods, steps, and functions disclosed herein. The memory 330 could be distributed or local and the processor device 320 could be distributed or singular. The memory 330 could be implemented as an electrical, magnetic or optical memory, or any combination of these or other types of storage devices. Moreover, the term "memory" should be construed broadly enough to encompass any information able to be read from, or written to, an address in the addressable space accessed by processor device 320. With this definition, information on a network, accessible through network interface 325, is still within memory 330 because the processor device 320 can retrieve the information from the network. It should be noted that each distributed processor that makes up processor device 320 generally contains its own addressable memory space. It should also be noted that some or all of computer system 310 can be incorporated into an application-specific or general-use integrated circuit.

Optional display 340 is any type of display suitable for interacting with a human user of apparatus 300. Generally, display 340 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for reducing uncertainty in a hydraulic model of a water distribution network due to uncertain parameters and faults in the water distribution network, the method comprising the steps of:
   (i) calculating an optimized placement of sensors throughout a given uncertain section of the water distribution network and moving one or more of the sensors to locations indicated by the optimal placement;
   (ii) collecting data from the sensors, and repeatedly moving the sensors and collecting data from the sensors until sensors have been placed and data has been collected from the locations indicated by the optimal placement;
   (iii) partitioning the given uncertain section of the water distribution network into observable and unobservable sub-sections based on the hydraulic model, and one or more of a) a position, b) a number, and a c) type of the sensors that are available;
   (iv) correcting uncertain parameters and identifying faults for each of the observable sub-sections;
   (v) calculating a global uncertainty value for each of the unobservable sub-sections; and
   (vi) repeating the steps (i)-(vi) iteratively, at each iteration selecting an uncertain sub-section of the water distribution network, until no uncertain sub-sections of the water distribution network remain,
   wherein during a first iteration the water distribution network as a whole is selected for analysis, and at each subsequent iteration sub-sections of the water distribution network are selected for analysis.

2. The method of claim 1, wherein the faults in the water distribution network comprise leaks.

3. The method of claim 1, wherein the optimized placement of the sensors throughout the water distribution network is calculated based on a number of sensors available and types of sensors available.

4. The method of claim 1, wherein one or more of the sensors comprise hydraulic sensors.

5. The method of claim 4, wherein the hydraulic sensors are selected from the group consisting of water pressure sensors and water flow sensors.

6. The method of claim 1, further comprising the step of: obtaining from a user uncertainty information for one or more parameters of the water distribution network.

7. The method of claim 6, wherein the uncertainty information is obtained from the user for one or more of pipe parameters, node demand and valve operational status in the water distribution network.

8. The method of claim 1, further comprising the step of: obtaining from a user a number and type of the sensors that are available.

9. The method of claim 1, further comprising the step of: obtaining from a user a position of fixed measurement points in the water distribution network.

10. The method of claim 1, further comprising the step of: calculating a minimum time-window for observation of the water distribution network by the sensors.

11. The method of claim 1, further comprising the step of: obtaining data from the sensors.

12. The method of claim 1, further comprising the step of: reporting the global uncertainty value for each of the unobservable sub-sections of the hydraulic model to a user.

13. An apparatus for reducing uncertainty in a hydraulic model of a water distribution network due to uncertain parameters and faults in the water distribution network, the apparatus comprising:
   a memory; and
   at least one processor device, coupled to the memory, operative to:
   (i) calculate an optimized placement of sensors throughout a given uncertain section of the water distribution network and direct movement of one or more of the sensors to locations indicated by the optimal placement;
   (ii) collect data from the sensors, and repeatedly direct movement of the sensors and collecting data from the sensors until sensors have been placed and data has been collected from the locations indicated by the optimal placement;

(iii) partition the given uncertain section of the water distribution network into observable and unobservable sub-sections based on the hydraulic model, and one or more of a) a position, b) a number, and c) a type of the sensors that are available;
(iv) correct uncertain parameters and identify faults for each of the observable sub-sections;
(v) calculate a global uncertainty value for each of the unobservable sub-sections; and
(vi) repeat the steps (i)-(vi) iteratively, at each iteration selecting an uncertain sub-section of the water distribution network, until no uncertain sub-sections of the water distribution network remain, wherein during a first iteration the water distribution network as a whole is selected for analysis, and at each subsequent iteration sub-sections of the water distribution network are selected for analysis.

14. The apparatus of claim 13, wherein the at least one processor device is further operative to:
obtain from a user uncertainty information for one or more parameters of the water distribution network.

15. The apparatus of claim 13, wherein the at least one processor device is further operative to:
obtain from a user a number and type of the sensors that are available.

16. The apparatus of claim 13, wherein the at least one processor device is further operative to:
obtain from a user a position of fixed measurement points in the water distribution network.

17. The apparatus of claim 13, wherein the at least one processor device is further operative to:
calculate a minimum time-window for observation of the water distribution network by the sensors.

18. The apparatus of claim 13, wherein the at least one processor device is further operative to:
obtain data from the sensors.

19. An article of manufacture for reducing uncertainty in a hydraulic model of a water distribution network due to uncertain parameters and faults in the water distribution network, comprising a non-transitory computer readable medium containing computer instructions stored therein for causing a computer processor to perform the steps of:
(i) calculating an optimized placement of sensors throughout a given uncertain section of the water distribution network and directing movement of one or more of the sensors to locations indicated by the optimal placement;
(ii) collecting data from the sensors and repeatedly directing movement of the sensors and collecting data from the sensors until sensors have been placed and data has been collected from the locations indicated by the optimal placement;
(iii) partitioning the given uncertain section of the water distribution network into observable and unobservable sub-sections based on the hydraulic model and one or more of a) a position, b) a number, and a c) type of the sensors that are available;
(iv) correcting uncertain parameters and identifying faults for each of the observable sub-sections;
(v) calculating a global uncertainty value for each of the unobservable sub-sections; and
(vi) repeating the steps (i)-(vi) iteratively, at each iteration selecting an uncertain sub-section of the water distribution network, until no uncertain sub-sections of the water distribution network remain, wherein during a first iteration the water distribution network as a whole is selected for analysis, and at each subsequent iteration sub-sections of the water distribution network are selected for analysis.

* * * * *